US008642120B2

(12) United States Patent
Rajala et al.

(10) Patent No.: US 8,642,120 B2
(45) Date of Patent: Feb. 4, 2014

(54) METHOD AND APPARATUS FOR COATING GLASS SUBSTRATE

(75) Inventors: Markku Rajala, Vantaa (FI); Sami Kauppinen, Helsinki (FI)

(73) Assignee: Beneq Oy, Vantaa (FI)

( * ) Notice: Subject to any disclaimer, the term of this patent is extended or adjusted under 35 U.S.C. 154(b) by 45 days.

(21) Appl. No.: 13/318,566

(22) PCT Filed: Jun. 8, 2010

(86) PCT No.: PCT/FI2010/050469
§ 371 (c)(1),
(2), (4) Date: Nov. 2, 2011

(87) PCT Pub. No.: WO2010/142847
PCT Pub. Date: Dec. 16, 2010

(65) Prior Publication Data
US 2012/0070579 A1    Mar. 22, 2012

(30) Foreign Application Priority Data
Jun. 10, 2009   (FI) ..................................... 20095651

(51) Int. Cl.
*B05D 5/06* (2006.01)
(52) U.S. Cl.
USPC ............. 427/165; 427/166; 65/60.1; 118/725
(58) Field of Classification Search
USPC ............. 427/164, 165, 166; 65/60.1; 118/725
See application file for complete search history.

(56) References Cited

U.S. PATENT DOCUMENTS

| 2,564,708 | A | | 8/1951 | Mochel |
| 4,232,065 | A | | 11/1980 | Marcantonio et al. |
| 4,278,735 | A | | 7/1981 | Marcantonio et al. |
| 4,323,598 | A | | 4/1982 | Okino et al. |
| 4,414,015 | A | | 11/1983 | Van Laethem et al. |
| 4,735,861 | A | | 4/1988 | Carlson |
| 5,445,324 | A | * | 8/1995 | Berry et al. ..................... 239/99 |
| 5,882,368 | A | * | 3/1999 | Falcony-Guajardo et al. 65/60.1 |
| 6,635,307 | B2 | * | 10/2003 | Huang et al. .................... 427/74 |
| 6,800,333 | B2 | * | 10/2004 | Choy et al. ..................... 427/475 |
| 6,846,513 | B2 | * | 1/2005 | Furusawa et al. .......... 427/248.1 |
| 2005/0067503 | A1 | * | 3/2005 | Katase ........................... 239/373 |
| 2007/0223096 | A1 | * | 9/2007 | O'Connor et al. ............. 359/584 |

FOREIGN PATENT DOCUMENTS

EP    1 926 109 A1    5/2008
JP    A-56-096749     8/1981

OTHER PUBLICATIONS

International Search Report issued in International Application No. PCT/FI2010/050469 dated Apr. 1, 2011.
International Preliminary Report on Patentability issued in International Application No. PCT/FI2010/050469 dated Oct. 5, 2011.

* cited by examiner

*Primary Examiner* — Bret Chen
(74) *Attorney, Agent, or Firm* — Oliff & Berridge, PLC

(57) ABSTRACT

A coating process for coating a surface of a glass substrate in normal air pressure, in which coating process at least one liquid starting material is atomized into droplets and the formed droplets are guided towards the surface to be coated. The formed droplets are vaporized substantially close to the surface to be coated before the droplets contact the surface to be coated by bringing to the coating process the thermal energy needed for vaporizing the droplets with the glass substrate.

27 Claims, 5 Drawing Sheets

METHOD AND APPARATUS FOR COATING GLASS SUBSTRATE

BACKGROUND OF THE INVENTION

Figure 1:
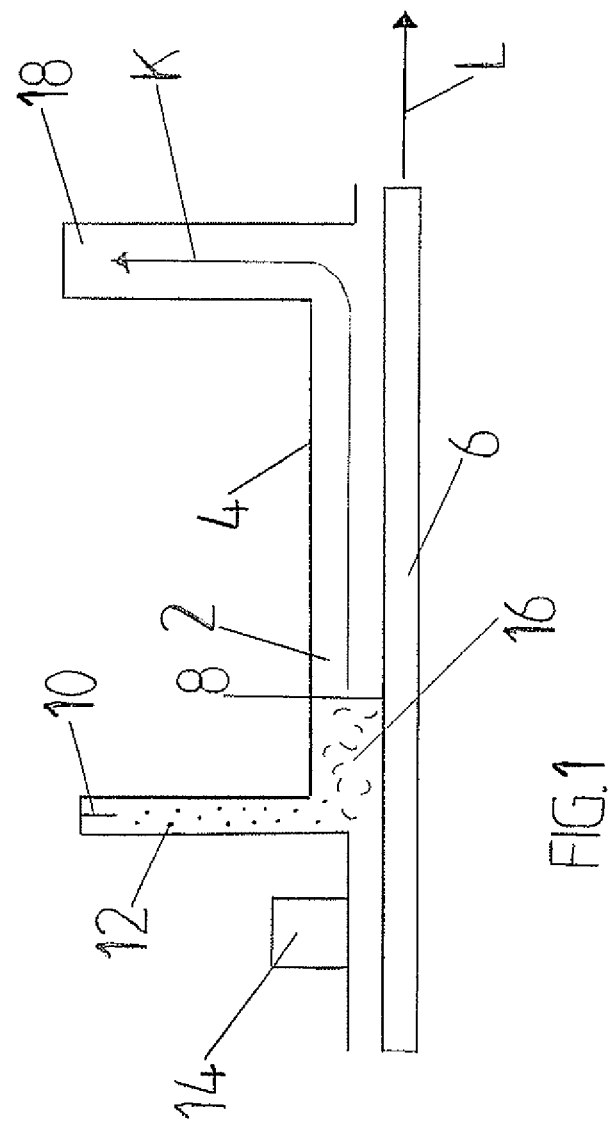

The invention relates to a coating process for coating a glass substrate and especially to a coating process for coating surface of a glass substrate in normal air pressure according to the preamble of claim 1. The present invention further relates to a coating apparatus for coating a glass substrate and especially to a coating apparatus for providing a coating on a surface of a glass substrate in normal air pressure according to the preamble of claim 14.

It is generally know to use liquid starting materials for coating glass by atomizing the liquid starting materials into droplets and directing the formed droplets on the surface of glass to be coated for producing a coating. In other words according to the prior art the droplets are brought to the surface of the substrate to be coated as liquid droplets, whereby the coating is formed on the surface of the substrate such that first the droplets brought on the surface are pyrolized or the vaporizable substances of the droplets are vaporized for providing a coating on the surface of the substrate.

The problem in the above identified prior art coating process is the slow growth rate of the coating, which is due to fact that the liquid droplets brought to the surface of the glass produce a liquid film on the surface of the glass. The pyrolization and vaporization of the liquid film is slow. The slow growth rate limits the utilization of this coating process in many applications such as when a coating is produced on a moving sheet glass. Furthermore, the uniformity of the produced coating is difficult to control in this prior art coating process.

U.S. Pat. No. 4,735,861, Ford Motor Company, Apr. 5, 1988, describes the production of a gray colour coating on a glass substrate. The coating is formed by formulating a solution of dissolved metal compounds, in a solvent therefor which will volatilize in the presence of heat and oxygen thereby permitting the metals to react with oxygen to develop a multimetal oxide coating adherent to the glass surface. The solution is sprayed on the glass surface. The metals are oxideized and part of the metal oxides so-developed become adherent to the surface of the glass substrate to form a film thereon. The coating formation is thus based on the deposition of metal oxide particles, not on surface reactions.

An other prior art method for providing a coating on a glass substrate is to use known vapour deposition methods such as CVD (chemical vapour deposition). In these conventional vapour deposition methods the surface of the glass substrate to be coated is subjected to vapour starting materials which react with the surface of the glass or with each other to form a coating on the surface of the glass.

The problem with these conventional prior art vapour deposition methods is that the staring materials are vaporized distant from the surface of the substrate to be coated and the vaporized starting materials are transported with a carrier gas to the substrate. The long transportation distance of the vaporized starting materials causes undesirable particle formation during the transportation of the vaporized starting materials. The undesirably formed particles end up to the surface of the substrate to be coated and therefore reduce the quality of the produced coating.

SUMMARY OF THE INVENTION

The object of the present invention is to provide a coating process and coating apparatus such that the above mentioned prior art problems are solved. The object of the present invention is achieved with a coating process according to the characterizing portion of claim 1. The objects of the present invention are further achieved with a coating apparatus according to the characterizing portion of claim 14.

The preferred embodiments of the present invention are defined in the independent claims.

The present invention is based on an idea of supplying the starting materials into the deposition chamber as liquid droplets and directing the droplets towards the surface of the glass substrate to be coated. The glass substrate is further brought to the coating process in such a temperature that the thermal energy of the glass substrate is able to vaporize the droplets substantially close to the surface of the glass substrate to be coated before the droplets contact with the surface of the glass substrate to be coated. According to one embodiment of the present invention the glass substrate or at least a surface layer of glass substrate is heated with heating means before the droplets are directed towards the surface of the glass substrate to be coated such that the glass substrate is able to vaporize the droplets substantially close to the surface to be coated. Alternatively the glass substrate or a surface layer of the glass substrate may be heated after the coating process, thus after the glass substrate has transferred thermal energy for the vaporization of the droplets. The heating of the glass substrate is used for compensating the thermal energy escaped from the glass substrate for vaporizing the droplets such that undesirable cooling of the glass substrate may be avoided due to the coating. The heating of the glass substrate may also be used for raising the temperature of the glass substrate to such a level that the glass substrate is able to transfer the required to vaporize the droplets.

The vaporized starting materials react on the substrate surface to produce a desired coating or film on the substrate. As the starting materials are vaporized close to the substrate surface, the vapour pressure of the starting materials at the substrate surface is high, thus allowing high coating growth rates.

The advantage of the coating process and coating apparatus of the present invention is that they combine the advantages of prior art coating methods such that the problems associated with the prior art coating methods are solved. The coating process and coating apparatus of the present invention provide an increased growth rate of the coating in relation to the prior art methods in which the starting materials are brought to the surface of the glass substrate as liquid droplets due to the fact that the surface reactions take place when the staring materials are vaporized. Furthermore, as the vaporization of the liquid droplets takes place substantially close to the surface of the substrate to be coated the undesirable particle formation may be avoided as the vaporized starting materials do not have be transferred long distances to the surface of the substrate. Supplying the starting materials as droplets into the deposition chamber requires more simple equipment that supplying the starting materials in gas phase into the deposition chamber. This enables the coating process to be applied easily to different kinds of applications, such as production lines and process lines.

BRIEF DISCLOSURE OF THE DRAWINGS

Figure 2:
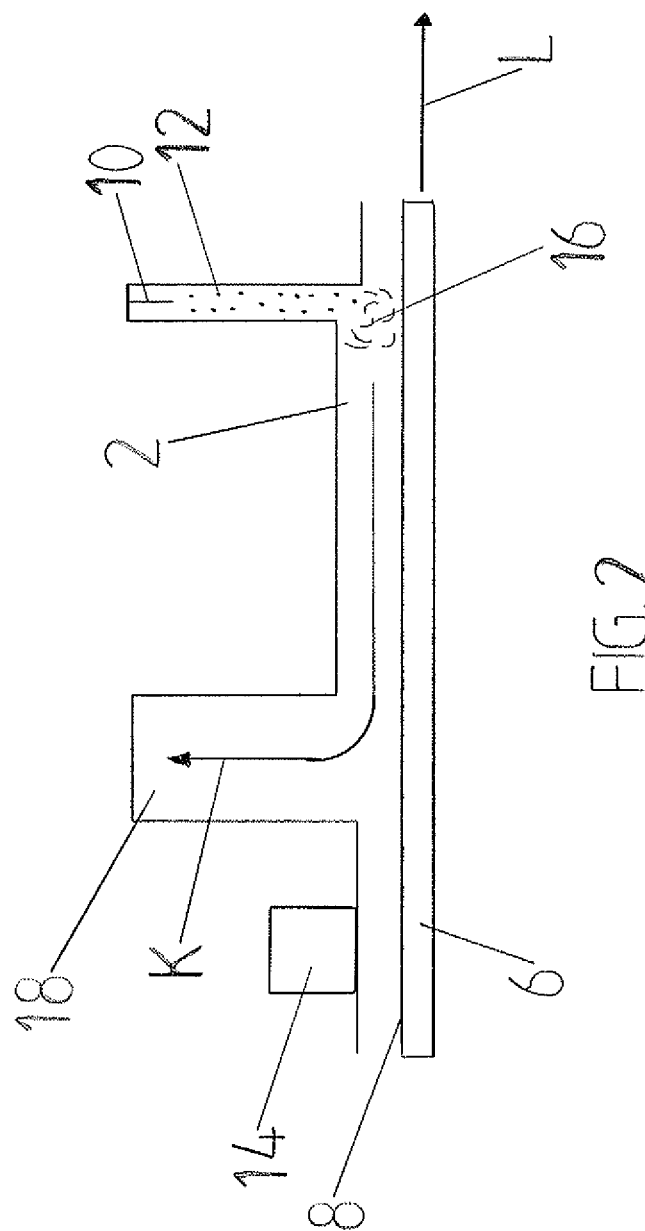
Figure 3:
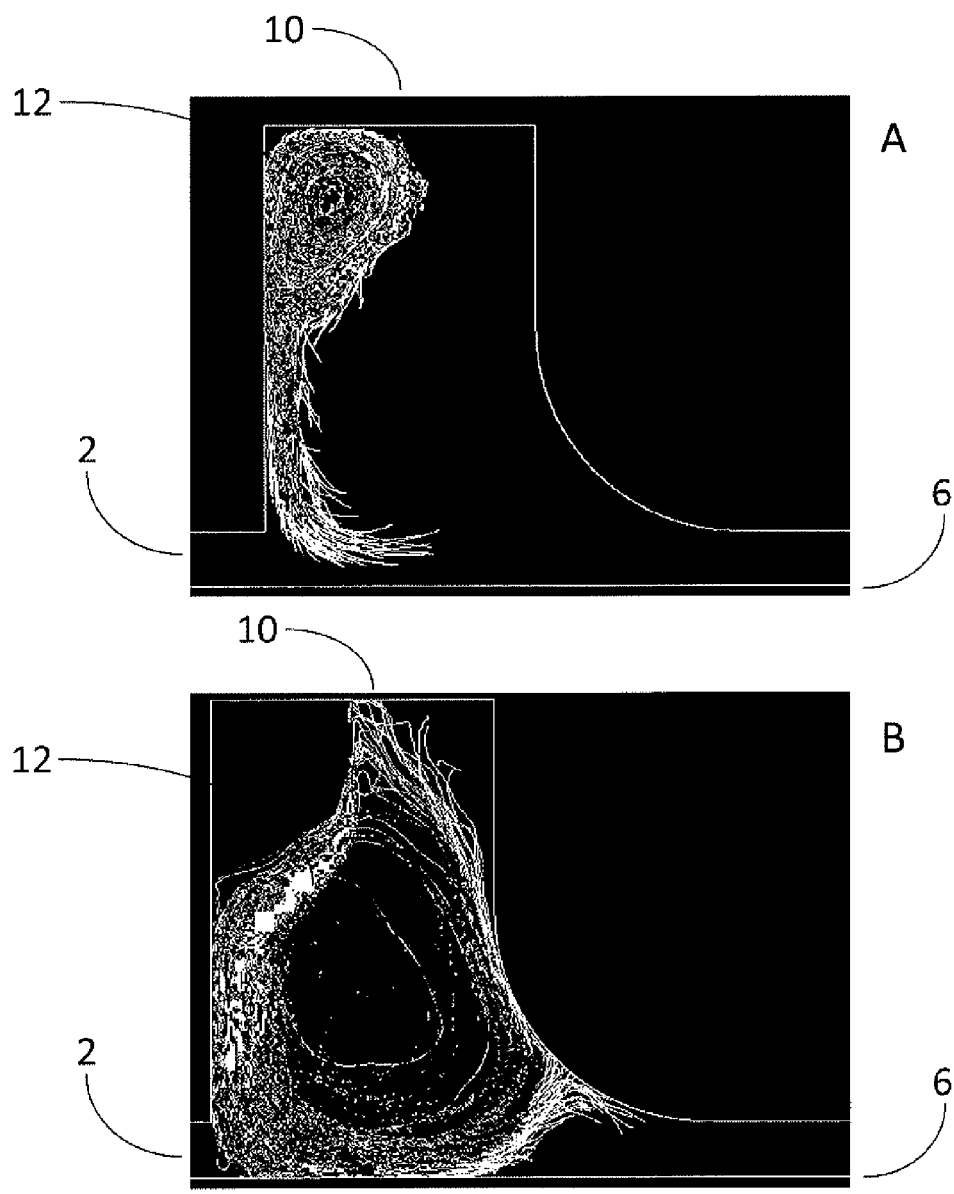
Figure 4:
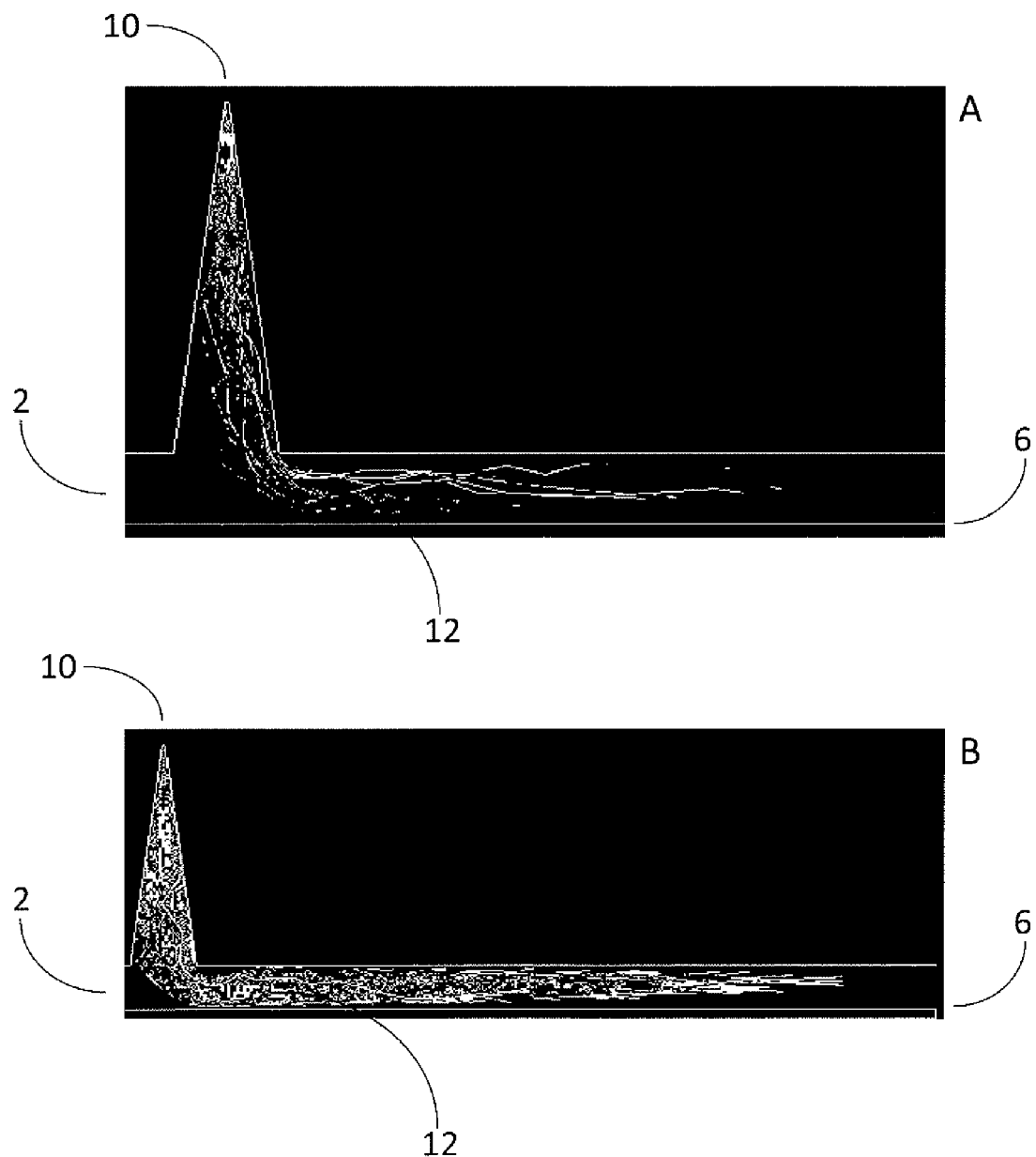
Figure 5:
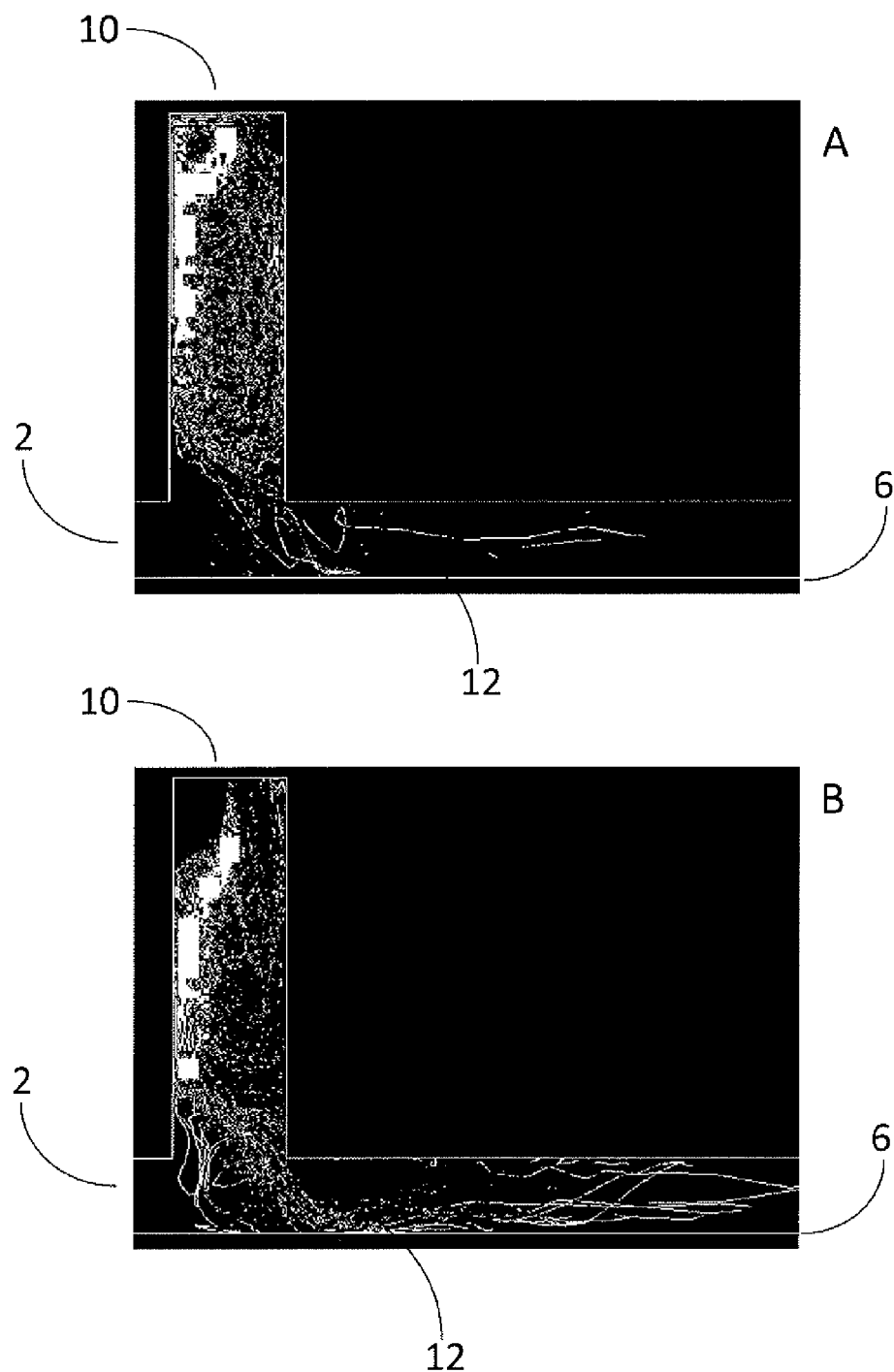

In the following the present invention will be disclosed in further detail in connection with the enclosed figures in which FIG. 1 schematically shows one embodiment of a coating apparatus according to the present invention;

FIG. 2 schematically shows another embodiment of a coating apparatus according to the present invention; and FIGS. 3-5 show the effect of different designs of the coating apparatus on coating process.

DETAILED DESCRIPTION OF THE INVENTION

The coating process according to the present invention is carried out preferably in normal air pressure. Normal air pressure means in this context atmospheric air pressure or a pressure substantially corresponding the atmospheric air pressure. In the coating process one or more liquid starting material is atomized into droplets with one or more atomizers. One or more liquid starting material may be conducted into an atomizer and furthermore same or different starting materials may be conducted to adjacent atomizers. The starting materials may be selected according to the coating to be produced. Atomized droplets are directed towards the surface of a glass substrate to be coated preferably in a deposition chamber. The atomizer may be for example a two fluid atomizer in which gas flow is used for atomizing the liquid starting material. The atomizer is preferably provides such that it may give the droplets a velocity towards the surface of the glass substrate to be coated. Alternative a different kind of atomizer may be used for providing small droplets.

The glass substrate is brought to the coating process in an elevated temperature or at least a surface or surface layer of the glass substrate is in elevated temperature. The liquid droplets directed towards the surface of the glass substrate to be coated are vaporized substantially close to the surface to be coated. The thermal energy needed for vaporizing the droplets is transferred from the hot or heated glass substrate. Thus no separate means are needed for vaporizing the droplets, but the thermal energy radiated from the glass substrate vaporizes the droplets substantially close to the surface to be coated before the droplets contact with the surface to be coated. In other words the thermal energy needed for vaporizing the droplets is brought to the coating process with the glass substrate. The glass substrate may be heated throughout. Alternatively or additionally a surface or a surface layer of the glass substrate may be heated.

When the droplets are vaporized the surface reactions and other reactions take place in gas phase. Thus the coating is provided on the surface of the glass substrate with one or more vaporized starting materials. The coating may be formed due to surface of the glass substrate to be coated when one or more of the vaporized starting materials react directly with the surface of the glass substrate to be coated. Alternatively the coating may be formed on the surface of the glass substrate to be coated when two or more vaporized starting materials react with each other, whereby the formed reaction products may react with the surface of the glass substrate to be coated. One or more of the vaporized starting materials may also react into particles before they contact with the surface of the substrate to be coated. The particles are further directed to the surface of the glass substrate to be coated for providing at least part of the coating by the particles. In addition to the starting materials supplied to the deposition chamber one or more gases taking part to the formation of the coating may be supplied in to the deposition chamber. This kind of gas may be for example oxygen or some other oxygen containing gas taking part in formation of oxide coating.

For vaporizing the droplets before they contact with the surface of the glass substrate to be coated and substantially close to the surface of the glass substrate to be coated, the conditions for the vaporization has to be provided suitable for vaporization. The vaporization of the droplets is influenced primarily by the size of the droplets, temperature and residence time in an elevated temperature. Therefore the atomizer is arranged to produce droplets having average diameter less than 10 micrometers, preferably about 3 micrometer. Alternatively or additionally size distribution of the formed droplets is in range 1-10 micrometers meaning that more than 80% of the droplets fall within this range. In other words smaller droplets vaporize more easily due their greater specific surface area, whereby it is advantageously to use these smaller droplets. The glass substrate may also be provided to desired temperature by heating before the coating process. The residence time of the droplets in the elevated temperature may be altered by adjusting the velocity of the droplets with which they are directed towards the surface of the glass substrate to be coated. Accordingly the vaporization of the droplets is dependent on at least above mentioned parameters, whereby the absolute values of the above parameters are always specific to each embodiment and application.

The glass substrate may be sheet glass or any other glass product. The glass substrate may be brought to the coating process directly from a production process or a process step of a production process of the glass substrate, in which the glass substrate has the thermal energy needed for vaporizing the droplets substantially close to the surface of the glass substrate to be coated. Alternatively the coating process may be applied in a production process or working process of the glass substrate. Therefore the coating process of the present invention may be used coating process for coating sheet glass on a production line of the sheet glass (float line) and/or for coating sheet glass on a hardening line of the sheet glass and/or for coating glass substrates on a production line of glass substrates for photovoltaic cells. In the mentioned applications temperature of the glass substrate is preferably under 650° C., preferably under the glass hardening temperature. The present invention also allows the top surface or top surface layer to be heated over the glass hardening temperature as the temperature of the under side of the glass substrate is kept substantially under the glass hardening temperature.

Relating now to FIG. 1, it is shown schematically one embodiment of a coating apparatus according to the present invention for coating a glass substrate 6. The coating apparatus of this embodiment is provided to be used for example for coating a surface of a moving glass substrate 6. The coating apparatus comprises a deposition chamber 2, in which the coating is performed substantially isolated from the ambient atmosphere. The deposition chamber 2 may be isolated from the ambient atmosphere for example with gas curtains (not shown). According to FIG. 1, the deposition chamber 2 is formed with a wall of the coating apparatus, the gas curtains and the top surface 8 of the glass substrate 6.

In connection with the deposition chamber 2 is provided at least one atomizer 10 for atomizing one or more liquid starting materials into droplets 12. The atomizer 10 is preferably a two fluid atomizer, in which atomizing gas is used for atomizing the liquid in to droplets 12. Alternatively the atomizer 10 may be some other kind of atomizer producing small droplets. The atomizer 10 is advantageously arranged to produce droplets 12 having average diameter smaller than 10 micrometers, preferably about 3 micrometers. Furthermore, the atomizer 10 is arranged to produce droplets having size distribution in range 1-10 micrometers. The produced droplets 12 are directed towards the surface 8 of the glass substrate 6 to be coated with the atomizer 10 or with a carrier gas.

The coating apparatus may comprise heating means 14 for heating glass substrate 6 or the surface 8 or a surface layer of the glass substrate 6 to a desired temperature. The heating means 14 may comprise one or more flames, furnaces, heating resistor or heating gas flow for heating the glass substrate 6 or at least a surface layer of the surface 8 of the glass substrate 6 to be coated. One preferred embodiment is a hot gas stream directed towards the surface of the glass substrate 6 for heating with forced convection. The heating means 14 are placed such that the glass substrate 6 or a surface layer of the surface 8 of the glass substrate 6 to be coated may be heated before the droplets 12 are directed towards the surface 8 of the substrate 6 to be coated for vaporizing the droplets 12 before they contact with the surface 8 to the coated.

According to FIG. 1 the glass substrate 6 is arranged to be transported under the coating apparatus in direction of the arrow L, from left to right in FIG. 1. The heating means 14 are according to FIG. 1 placed in the movement direction of the glass substrate 6 prior to the deposition chamber 2 such that the glass substrate 6 or a surface 8 of the glass substrate 6 may be heated before the glass substrate 6 enters into the deposition chamber 2. Alternatively the heating means 14 could be placed also inside the deposition chamber 2, preferably such that the glass substrate 6 or the surface 8 of the glass substrate 6 may be heated to desired temperature before the point in which the droplets are directed towards the surface 8 of the glass substrate 6. In yet an alternative embodiment the heating means 14 may be arranged such that they heat the glass substrate 6 or the surface 8 of the glass substrate 6 after the coating the surface 8, thus after the droplets 12 have been vaporized. Heating may also be arranged such that they can heat the glass substrate 6 before and after the coating of the substrate 6. If the substrate 6 has sufficient temperature before supplying the substrate 6 into the coating apparatus, the heating of the glass substrate 6 does not have to be performed necessary before the coating. Transferring the thermal energy needed for vaporizing the droplets from the glass substrate 6 cools down the surface 8 of the glass substrate 6 to be coated. One purpose of the heating of the glass substrate with the heating means 14 is therefore to compensate the cooling of the surface 8 of the glass substrate 6 before or after the coating. In other words the heating means 14 are preferably arranged to give the glass substrate substantially the same amount of thermal energy as needed for vaporizing the droplets 12. The heating means may be arranged prior to the deposition chamber 2, after the deposition chamber 2 or in the deposition chamber 2 as preferable.

The thermal energy of the glass substrate 6 vaporizes the droplets 12 into vaporized starting materials 16 substantially close to the surface 8 of the glass substrate 6 to be coated before the droplets contact with the surface 8. The vaporized starting materials 16 further react with the surface 8 to be coated for providing a coating on the surface 8. Therefore the coating may be performed continuously as the glass substrate 8 moves through the deposition chamber 2. The vaporized starting materials 16 are removed from the deposition chamber 2 with the exhaust 18, which provides suction into the deposition chamber 2. Therefore the vaporized starting materials 16 move through the deposition chamber 2 in the direction of arrow K, from left to right in FIG. 1. According to this embodiment the exhaust 18 is positioned downstream of the atomizer 10 in the moving direction of the glass substrate 8. Thus in this embodiment it is shown that the moving direction L of the glass substrate 6 and the flowing direction K of the vaporized starting materials 16 in the deposition chamber 2 are substantially equal, thus the glass substrate 6 and the vaporized starting materials 16 move in the same direction.

FIG. 2 shows another embodiment of the coating apparatus according to the present invention. In this embodiment the vaporized starting materials 16 and the glass substrate 6 are arranged to move in opposite direction in the deposition chamber 2. In that case also the positions of atomizer 10 and the exhaust have to be changed relative to the moving direction L of the substrate 6. Therefore the exhaust 18 providing suction into the deposition chamber 2 is positioned upstream of the atomizer 10 in the moving direction L of the glass substrate 6. The droplets 12 enter the deposition chamber 2 at the atomizer 10, substantially below the atomizer 10, and towards the glass substrate 6. The thermal energy of the glass substrate 6 vaporizes the droplets 12 substantially close to the surface 8 of the glass substrate 6. The exhaust 18 provides suction into the deposition chamber 2 moving vaporized starting materials 16 in direction K which is opposite to the moving direction L of the glass substrate 6, as can be seen from FIG. 2. The movement of the vaporized starting materials 16 provides a vapour layer on the surface 8 of the glass substrate 6. The vapour layer moves from the atomizer 10 to the exhaust 18 in direction K. In FIG. 1 the vapour layer moves in the same direction with the glass substrate 6 and in FIG. 2 in opposite direction in relation to the glass substrate 6.

As may be understood from the above and from FIG. 2, the embodiment in which the vapour layer and the glass substrate 6 move in opposite directions has the advantage that the thermal energy needed for vaporizing the droplets 12 is absorbed from the part surface 8 of the glass substrate 6 that has already been in contact with the vaporized starting materials 16. Thus the thermal energy for vaporizing the droplets 12 is absorbed from the part of the substrate 6 that has already been coated. This has the advantage that the absorption of thermal energy from the substrate 6 and the surface 8 of the substrate does not influence the coating of the surface 8 and deposition of the vaporized starting materials 16 on the surface 8.

While the apparatus of FIGS. 1 and 2 is arranged to be operated continuously for coating glass substrates 6 transferred through the deposition chamber 2, the apparatus according to the present invention may also be arranged to be operated as a batch process. In a batch process a glass substrate 6 to be coated is first fed inside the deposition chamber 2 and then the glass substrate 6 or at least a surface layer of a surface to be coated 8 is heated to desired temperature with heating means 14. The coating is started after the heating by atomizing at least one starting material with one or more atomizers 10 and directing the formed droplets 12 towards the surface to be coated 8 of the glass substrate 6. The thermal energy of the heated glass substrate vaporizes the droplets substantially close to the surface to be coated 8. The apparatus may further be arranged such that the vaporized starting materials 16 are sucked out of the deposition chamber 2 along the surface to be coated 8 for coating the whole surface. Alternatively or additionally the atomizers may be arranged to be moved such that it is possible to sweep over the surface to be coated one or more times, preferably parallel to the surface to be coated 8.

According to the above the apparatus of the present invention enables providing a coating on a glass substrate in normal air pressure by atomizing at least one liquid starting material into droplets 12 and directing the droplets 12 the droplets towards the surface to be coated 8 of the glass substrate 6. The heating means 14 are used to heat at least a surface layer of the surface to coated 8 for compensating the cooling of the substrate 6 due to the vaporization of the droplets 12. The apparatus may be arranged to coat sheet glass or other glass products. The apparatus may further be placed in connection with a production apparatus or processing apparatus of a glass substrate or it may be arranged as a separate process. In one embodiment of the present invention the apparatus is placed in connection with a production line of the sheet glass (float line) and/or a hardening line of the sheet glass and/or a production line of glass substrates for photovoltaic cells.

FIGS. 3-5 show the effect of different designs of the deposition chamber 2 on the droplet 12 behaviour. In all FIGS. 2-4, the figure A refers to a computational fluid dynamics (CFD) model, where all droplets 12 are monodispersive with a droplet diameter of 1 micrometer and the figure B refers to monodispersive, 10 micrometer droplets. The droplets 12 are produced by the atomizer 10 and their trajectories are drawn on the figure. The glass substrate 6 is also shown. It may be seen from FIGS. 2-4 that the actual evaporation and deposition of the droplets 12 on the glass substrate 6 depends greatly on the design of the deposition chamber 2. However, the inventors have observed a general guideline that droplets 12 with a diameter of less than 1 micrometer tend to diffuse easily on the walls of the deposition chamber 2 and droplets 12 having a diameter greater than 10 micrometers are easily impacted on the glass substrate 6. Thus droplets 12 in a size range 1-10 micrometers are preferable in ensuring good droplet evaporation, little soiling of the deposition chamber 2 and good vapour flow to the glass substrate 6. Preferably the mean diameter of the droplets should be about 3 micrometers.

According to the above mentioned in the present invention a hot glass substrate is used for supplying the amount of thermal energy to the coating process needed for vaporizing droplets formed from at least one liquid starting material and directed towards the surface to be coated of the glass substrate substantially close to the surface to be coated.

It will be obvious to a person skilled in the art that, as the technology advances, the inventive concept can be implemented in various ways. The invention and its embodiments are not limited to the examples described above but may vary within the scope of the claims.

The invention claimed is:

1. A process for coating a surface of a glass substrate in normal air pressure, comprising:

atomizing at least one liquid starting material into droplets and guiding the formed droplets towards the surface to be coated; and vaporizing the formed droplets with sufficient thermal energy that is radiated from the glass substrate before the droplets contact the surface to be coated, such that the starting material reacts in gas phase on the surface of the glass substrate;

wherein:

the thermal energy needed to vaporize the formed droplets before the droplets contact the surface to be coated is supplied to the glass substrate before the coating of the substrate begins.

2. The process according to claim 1, further comprising heating the glass substrate before performing the coating process or after performing the coating process.

3. The process according to claim 1, further comprising supplying the glass substrate to the coating process directly from a manufacturing process of the glass substrate or from a step of a manufacturing process of the glass substrate, in which the thermal energy needed for vaporizing the droplets is supplied to the glass substrate in the manufacturing process of the glass substrate or the step of the manufacturing process of the glass substrate.

4. The process according to claim 1, wherein the surface is coated with two or more vaporized starting materials.

5. The process according to claim 4, wherein the coating is provided to the surface to be coated when one or more of the vaporized starting materials reacts with the surface to be coated of the glass substrate.

6. The process according to claim 4, wherein the coating is provided to the surface to be coated when two or more of the starting materials react together.

7. The process according to claim 4, wherein the coating is provided to the surface to be coated when one or more reaction products, generated as a result of a reaction of at least one vaporized starting material, reacts with the surface to be coated.

8. The process according to claim 1, wherein the one or more of the vaporized starting materials reacts to particles and the particles are directed to the surface to be coated.

9. The process according to claim 1, wherein an average diameter of the formed droplets is smaller than 10 micrometers.

10. The process according to claim 1, wherein an average diameter of the formed droplets is about 3 micrometers.

11. The process according to claim 1, wherein a size distribution of the formed droplets is 1-10 micrometers.

12. The process according to claim 1, wherein the glass substrate is sheet glass or other glass product.

13. The process according to claim 1, wherein the coating process is carried out while coating sheet glass on a production float line of the sheet glass, and/or while coating sheet glass on a hardening line of the sheet glass, and/or while coating glass substrates on a production line of glass substrates for photovoltaic cells.

14. A coating apparatus for providing a coating on a surface of a glass substrate in normal air pressure, comprising:

a deposition chamber provided with at least one atomizer for atomizing at least one liquid starting material into droplets and guiding the formed droplets towards the surface to be coated;

wherein the apparatus is configured for:

vaporizing the formed droplets with sufficient thermal energy that radiates from the glass substrate before the droplets contact the surface to be coated, such that the starting material reacts in gas phase on the surface of the glass substrate; and supplying to the glass substrate, before the coating of the substrate begins, the thermal energy needed to vaporize the formed droplets before the droplets contact the surface to be coated.

15. The coating apparatus according to claim 14, wherein the coating apparatus is arranged to absorb from the glass substrate the thermal energy needed to vaporize the droplets.

16. The coating apparatus according to claim 14, further comprising at least one heating means for heating the glass substrate.

17. The coating apparatus according to claim 16, wherein the heating means are arranged to supply substantially the amount of thermal energy needed for vaporizing the droplets to the glass substrate before coating of the surface of the glass substrate begins.

18. The coating apparatus according to claim 16, wherein the heating means are arranged to heat the glass substrate before the glass substrate is fed into the deposition chamber and/or after the glass substrate is removed from the deposition chamber and/or when the glass substrate is in the deposition chamber.

19. The apparatus according to claim 16, wherein the heating means comprise one or more flames, furnace, heating resistor, or heating gas stream.

20. The apparatus according to claim 14, wherein the deposition chamber is provided such that the coating of the glass substrate is carried out substantially isolated from an ambient atmosphere.

21. The apparatus according to claim 14, wherein coating apparatus is arranged to operate for coating glass substrate passing continuously through the deposition chamber.

22. The apparatus according to claim 14, wherein the coating apparatus is arranged to operate as a batch process.

23. The apparatus according to claim 14, wherein the at least one atomizer is arranged to form droplets having an average diameter smaller than 3 micrometers.

24. The apparatus according to claim 14, wherein the at least one atomizer is arranged to form droplets having an average diameter smaller than 1 micrometer.

25. The apparatus according to claim 14, wherein the at least one atomizer is arranged to form droplets having a size distribution of 1-10 micrometers.

26. The apparatus according to claim 14, wherein the glass substrate is a sheet glass or other glass product.

27. The apparatus according to claim 14, wherein the apparatus is placed in connection with a production float line of sheet glass, and/or a hardening line of sheet glass, and/or a production line of glass substrates for photovoltaic cells.

\* \* \* \* \*